(12) United States Patent
Moles

(10) Patent No.: US 9,667,207 B2
(45) Date of Patent: May 30, 2017

(54) AMPLIFIER CONTROL APPARATUS

(71) Applicant: KSC Industries Incorporated, Chula Vista, CA (US)

(72) Inventor: Steven C. Moles, La Mesa, CA (US)

(73) Assignee: KSC Industries, Inc., San Diego, CA (US)

( * ) Notice: Subject to any disclaimer, the term of this patent is extended or adjusted under 35 U.S.C. 154(b) by 0 days.

(21) Appl. No.: 14/528,867

(22) Filed: Oct. 30, 2014

(65) Prior Publication Data

US 2016/0126907 A1     May 5, 2016

(51) Int. Cl.
*H03F 3/38*      (2006.01)
*H03F 3/217*     (2006.01)
*H03F 1/02*      (2006.01)

(52) U.S. Cl.
CPC .......... *H03F 3/217* (2013.01); *H03F 1/0227* (2013.01); *H03F 2200/102* (2013.01); *H03F 2200/351* (2013.01); *H03F 2200/435* (2013.01)

(58) Field of Classification Search
CPC ........ H03F 3/68; H03F 3/2171; H03F 3/2173; H03F 2200/331

USPC ....... 327/131–137; 330/10, 127, 136, 207 A, 330/251, 280, 297; 347/9; 381/120
See application file for complete search history.

(56) References Cited

U.S. PATENT DOCUMENTS

| | | | |
|---|---|---|---|
| 7,741,914 B1 * | 6/2010 | Nabicht | H03F 1/0222 330/296 |
| 2009/0220110 A1 * | 9/2009 | Bazarjani | H03F 1/0211 381/120 |

* cited by examiner

*Primary Examiner* — Hafizur Rahman
(74) *Attorney, Agent, or Firm* — Knobbe Martens Olson & Bear, LLP

(57) ABSTRACT

An apparatus for controlling a pulse width modulation (PWM) amplifier is disclosed. In one aspect, the apparatus includes a delay circuit configured to delay an input signal and provide the delayed input signal to the PWM amplifier. The apparatus also includes a controller configured to generate and provide a supply voltage to the PWM amplifier based at least in part on the input signal such that the PWM amplifier generates an output signal based at least partially on the delayed input signal and the supply voltage.

17 Claims, 7 Drawing Sheets

AMPLIFIER CONTROL APPARATUS

BACKGROUND

Field

The described technology generally relates to an amplifier control apparatus, for example, an apparatus for controlling a pulse width modulation (PWM) amplifier.

Description of the Related Technology

In recent decades, the power electronics industry has witnessed PWM technology become a clear leader over traditional analog design due to its many advantages in terms of physical size, weight, thermal performance, and power efficiency. In contrast with representing signals as continuously varying analog voltages, PWM technology encodes signals as streams of digital pulses. The signal is encoded by changing the width of the pulses over time so that the pulse width (or equivalently, the duty cycle) tracks the signal being encoded.

The main advantage of PWM over analog is that it is much more energy efficient. Power dissipated in any circuit element is substantially equal to the product of current through the element times the voltage across it. In an analog circuit, the transistor conducts current and simultaneously has a voltage across it, and therefore always dissipates significant power. However, in an ideal PWM system, a transistor is either turned off (in which case its current is zero) or it is turned on (hence its voltage drop is zero), and therefore the transistor dissipates no power.

SUMMARY

The apparatuses and systems of the present disclosure have several features, no single one of which is solely responsibly for its desirable attributes. Without limiting the scope of this invention as expressed by the claims which follow, its more prominent features will now be discussed briefly. After considering this discussion, and particularly after reading the section entitled "Detailed Description," one will understand how the features of this disclosure provide several advantages over current amplifier control technology.

One inventive aspect is an apparatus for controlling a pulse width modulation (PWM) amplifier, comprising: a delay circuit configured to delay an input signal and provide the delayed input signal to the PWM amplifier; and a controller configured to generate and provide a supply voltage to the PWM amplifier based at least in part on the input signal such that the PWM amplifier generates an output signal based at least partially on the delayed input signal and the supply voltage.

Another aspect is an apparatus for controlling an amplifier, comprising: a delay circuit configured to delay an input signal and provide the delayed input signal to the amplifier; and a controller configured to generate and provide a supply voltage to the amplifier based at least in part on the input signal such that the amplifier generates an output signal based at least partially on the delayed input signal and the supply voltage.

Another aspect is a pulse width modulation (PWM) system, comprising: a delay circuit configured to delay an input signal; a pulse width modulation (PWM) amplifier configured to generate an output signal based at least partially on the delayed input signal and the supply voltage, and provide the output signal to a load; and a controller configured to generate and provide the supply voltage to the PWM amplifier based at least in part on the input signal.

BRIEF DESCRIPTION OF THE DRAWINGS

The above mentioned and other features of this disclosure will now be described with reference to the drawings of several embodiments of the present apparatus for controlling an amplifier, an apparatus for controlling a PWM amplifier, and a PWM system. The illustrated embodiments of the apparatuses and systems are intended to illustrate, but not to limit the disclosure. The drawings contain the following figures.

DETAILED DESCRIPTION

Figure 1:
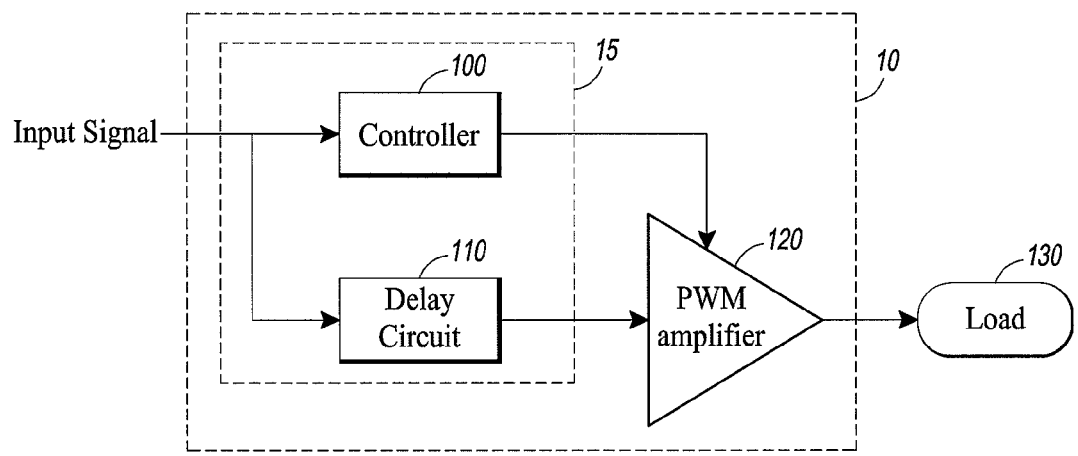
FIG. 1 illustrates an example PWM system including an apparatus for controlling a PWM amplifier according to one embodiment.

Although an ideal PWM switch (e.g., transistor) dissipates no power, a switch in a real PWM system requires time to transition from one state to another. During this time period, the switch is not fully blocking current, nor is it fully allowing it to flow. It is somewhere in between, and it is during this time period that power dissipation can occur. Generally, assuming the voltage and current ramps are linear, and that the transition time turning-on is the same as turning-off, switching losses are substantially proportional to a PWM switching frequency, rise and fall times of PWM waveforms, a load current, and a PWM amplifier supply voltage.

Various embodiments of the described technology reduce switching losses in a PWM system. For example, where possible, and within system constraints, the switching frequency and rise/fall times of the PWM waveforms are minimized. Furthermore, high quality transistors can be used with a low internal resistance ($R_{ds}(on)$) to reduce conduction losses and driver circuits can switch the transistors on and off as fast as possible. Moreover, various embodiments of the described technology dynamically adjust a supply voltage to be provided to an amplifier or a PWM amplifier in order to reduce switching losses in the system.

Embodiments will be described with respect to the accompanying drawings. Like reference numerals refer to like elements throughout the detailed description. In this disclosure, the term "substantially" includes the meanings of completely, almost completely or to any significant degree under some applications and in accordance with those skilled in the art. The term "connected" includes an electrical connection.

FIG. 1 illustrates an example PWM system 10 including a PWM amplifier control apparatus or control apparatus 15 according to one embodiment. The PWM system 10 can include the control apparatus 15 and a PWM amplifier 120. The PWM system 10 receives and processes an input signal, and outputs an output signal (e.g., an amplified signal) to a load 130. The input signal can be in an analog or digital form. If the input signal is in an analog form, the PWM system 10 or the control apparatus 15 can include an analog to digital converter (ADC) (not shown) that converts the input analog signal to a digital signal. Examples of the PWM system 10 include an audio signal processing system, a robotic and industrial motor control system, a telecommunication system, a medical imaging system, a drive system, a laser system, or other systems that include or have a signal communication with an amplifier or a PWM amplifier.

The control apparatus 15 includes a controller 100 and a delay circuit 110. The controller 100 can generate and provide a supply voltage to the PWM amplifier 120 based at least in part on the input signal. The controller 100 can dynamically adjust the supply voltage based on the input signal and at least one parameter. The at least one parameter can be adjustable. The controller 100 can monitor an output of the PWM amplifier 120 to be supplied to the load 130, and adjust the supply voltage based on the monitored output. The controller 100 can include a microcontroller. The controller 100 can be implemented as a hardware element and/or a software module.

The delay circuit 110 can delay the input signal and provide the delayed input signal to the PWM amplifier 120. The delay circuit 110 can provide the delayed input signal to the PWM amplifier 120 in substantial synchronization with the supply voltage. For example, the delay circuit can delay the input signal for a time period during which the controller 100 generates the supply voltage. The delay circuit 110 can have an adjustable delay, for example, in the range of about zero seconds to about several milliseconds. The delay circuit 110 can delay the input signal such that the input signal and the corresponding supply voltage arrive at the PWM amplifier 120 substantially simultaneously. The delay circuit 110 can use a delay parameter that compensates for any processing delay, a firmware response, and any physical lag in the controller 100. The value of the delay parameter can be determined in a laboratory and fixed within the firmware for a particular implementation. The delay circuit 110 can process a digital input signal or an analog input signal. The delay circuit 110 can be implemented as a hardware element and/or a software module.

The PWM amplifier 120 generates an output signal based at least partially on the delayed input signal received from the delay circuit 110 and the supply voltage received from the controller 100. The PWM amplifier 120 can amplify the received input signal based at least partially on the supply voltage. The PWM amplifier 120 can provide the amplified signal to the load 130. The PWM amplifier 120 can be a class-D amplifier that has a feedback function. Although FIG. 1 shows a PWM amplifier, other non-PWM amplifiers can also be used. For the purpose of simplicity, the description will be provided based on the PWM amplifier 120.

The load 130 can be a speaker of an audio signal processing system. The load 130 can also be a motor of a robotic and industrial motor control system. Furthermore, the load 130 can be a load element of a telecommunication system, a medical imaging system, a drive system, a laser system or other system that receives power from an amplifier or a PWM amplifier. The PWM system 10 can include the load 130 therein. For the purpose of simplicity, the description will be provided based on the PWM system 10 that does not include the load 130.

Figure 2:
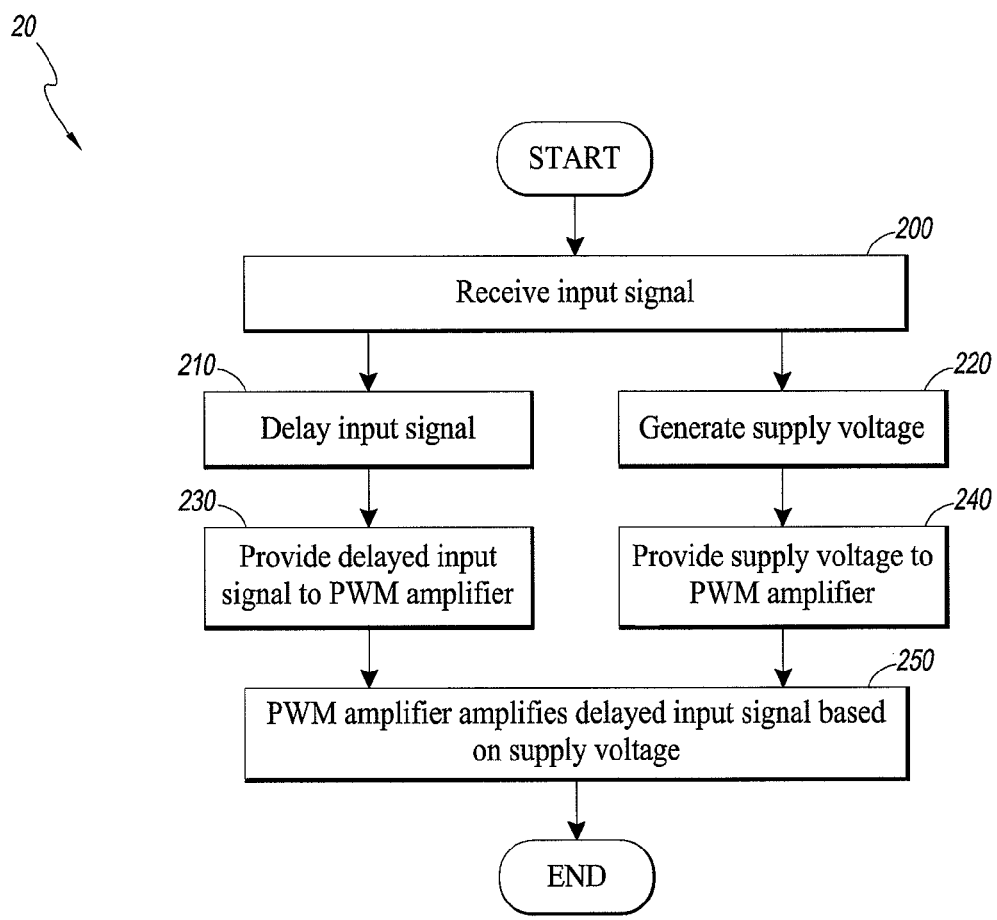
FIG. 2 is a flowchart showing an example operation of the PWM system of FIG. 1 according to one embodiment.

FIG. 2 is a flowchart showing an example operation or procedure 20 of the PWM system 10 of FIG. 1 according to one embodiment. In one embodiment, the procedure 20 of FIG. 2 (or at least part of the procedure) is implemented in a conventional programming language, such as C or C++ or another suitable programming language. In one embodiment, the program is stored on a computer accessible storage medium of the PWM system 10, for example, a memory (not shown) of the control apparatus 15 or the controller 100. In another embodiment, the program is stored in a separate storage medium. The storage medium may include any of a variety of technologies for storing information. In one embodiment, the storage medium includes a random access memory (RAM), hard disks, floppy disks, digital video devices, compact discs, video discs, and/or other optical storage mediums, etc. In another embodiment, the controller 100 is configured to or programmed to perform at least part of the above procedure 20. The program may be stored in the controller 100. The controller 100 can include a processor. In various embodiments, the processor may have a configuration based on, for example, i) an advanced RISC machine (ARM) microcontroller and ii) Intel Corporation's microprocessors (e.g., the Pentium family microprocessors). In one embodiment, the processor is implemented with a variety of computer platforms using a single chip or multi-chip microprocessors, digital signal processors, embedded microprocessors, microcontrollers, etc. In another embodiment, the processor is implemented with a wide range of operating systems such as Unix, Linux, Microsoft DOS, Microsoft Windows 7/Vista/2000/9x/ME/XP, Macintosh OS, OS/2, Android, iOS and the like. In another embodiment, at least part of the procedure 20 can be implemented with embedded software. Depending on the embodiment, additional states may be added, others removed, or the order of the states changed in FIG. 2. The description of this paragraph also applies to the procedure 50 of FIG. 5. Referring to FIG. 2, an example operation of the PWM system 10 will be described.

In state 200, the PWM system 10 receives an input signal from a source, for example, an audio player. In some embodiments, the input signal is a digital signal.

In other embodiments, the input signal is an analog signal. In these embodiments, the PWM system 10 includes an analog to digital converter (ADC) (not shown) which converts the input analog signal into a digital signal. As shown in FIG. 1, the input signal is provided to the delay circuit 110 and the controller 100. In state 210, the delay circuit 110 of the PWM system 10 delays the input signal, for example, for a time period during which the controller 100 generates the supply voltage. In state 220, the controller 100 generates the supply voltage based at least in part on the input signal.

In state 230, the delay circuit 110 provides the delayed input signal to the PWM amplifier 120. In state 240, the controller 100 provides the supply voltage to the PWM amplifier 120. In state 250, the PWM amplifier 120 generates an output signal based at least partially on the delayed input signal received from the delay circuit 110 and the supply voltage received from the controller 100. For example, the PWM amplifier 120 can amplify the delayed input signal based at least partially on the supply voltage. As discussed above, the delayed input signal and the supply voltage can substantially simultaneously arrive at the PWM amplifier 120.

Figure 3:
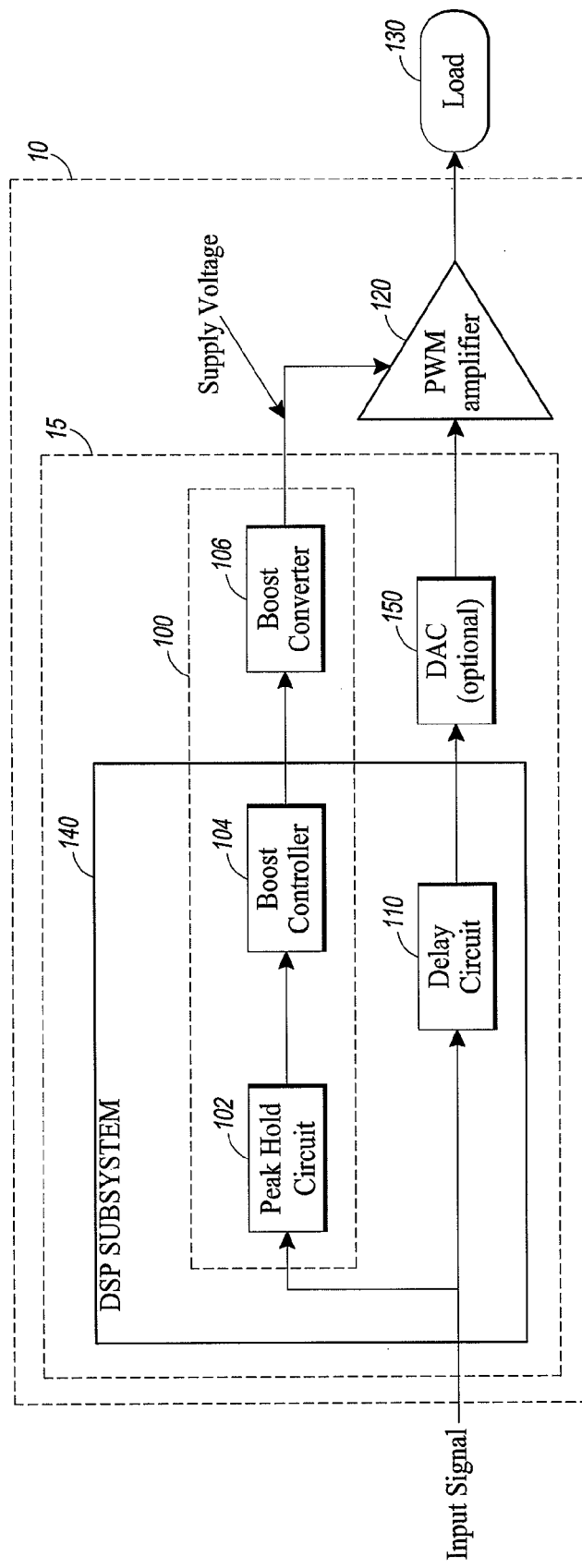
FIG. 3 is a detailed view of the PWM system of FIG. 1 according to one embodiment.

FIG. 3 is a detailed view of the PWM system 10 of FIG. 1 according to one embodiment. Depending on the embodiment, certain elements may be removed from or additional elements may be added to the PWM system 10 illustrated in FIG. 3. Furthermore, two or more elements may be combined into a single element, or a single element may be realized as multiple elements. This applies to the remaining embodiments.

The control apparatus 15 includes the controller 100 and the delay circuit 110. The control apparatus 15 can optionally include a digital to analog converter (DAC) 150. In some embodiments, as shown in FIG. 3, the controller 100 includes a peak hold circuit 102, a boost controller 104 and a boost converter 106.

The peak hold circuit 102 can track peaks of the input signal and generate a signal envelope. The peak hold circuit 102 can be implemented as a hardware element and/or a software module.

The boost controller 104 receives and transforms the signal envelope into a control signal. The control signal can include a PWM control voltage to control the boost converter 106. The boost controller 104 can include a microcontroller. The boost converter 106 can receive the PWM control voltage from the boost controller 104 and maintain the level of the PWM control voltage at a predetermined reference voltage or within a predetermined voltage range. The output of the boost converter 106 is provided to the PWM amplifier 120 as the supply voltage of the amplifier 120.

At least part of the control apparatus 15 can be realized as a digital signal processor (DSP) or DSP subsystem 140. For example, the peak hold circuit 102, the boost controller 104 and delay circuit 110 can be included in the DSP subsystem 140, as shown in FIG. 3. The PWM amplifier 120 can process the delayed input signal either in a digital form or an analog form. The optional DAC 150 converts the (delayed) digital input signal into an analog signal.

Figure 4:
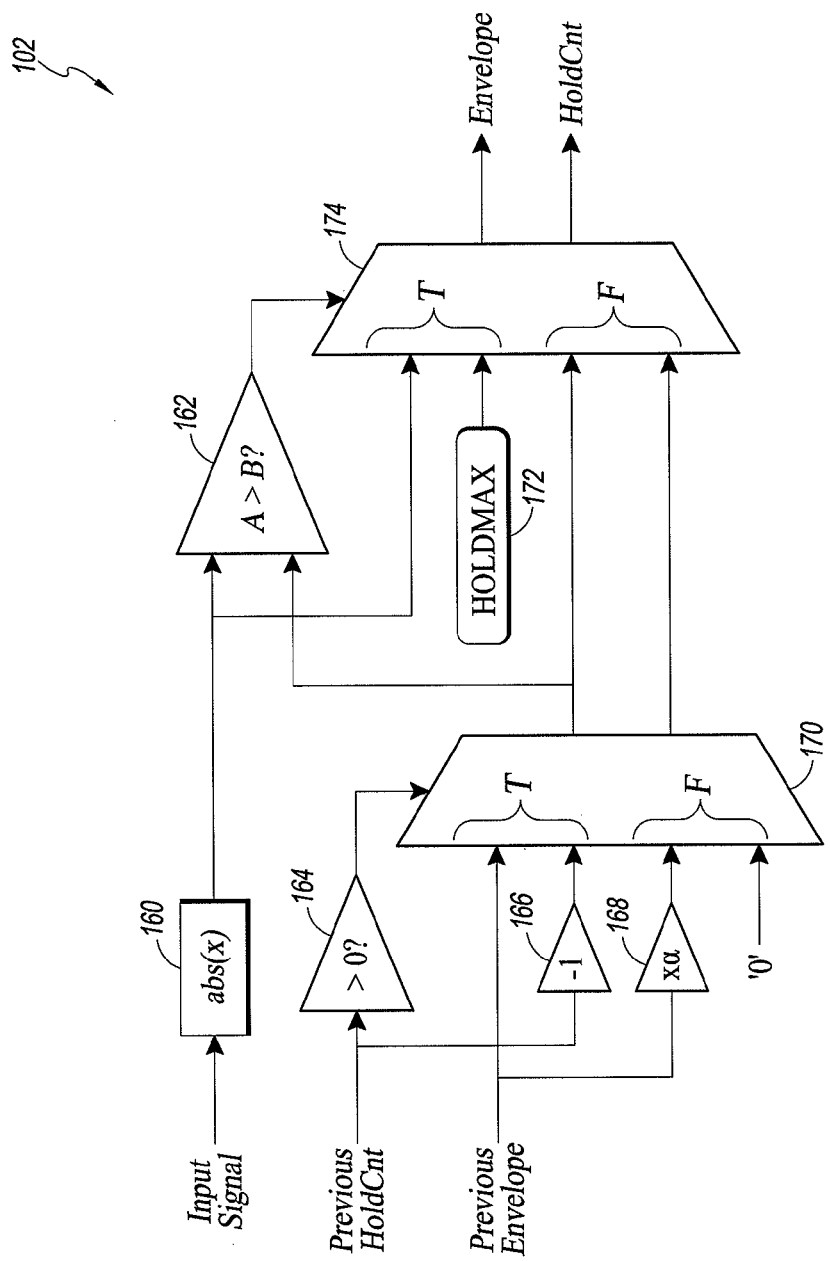
FIG. 4 illustrates an example schematic diagram of the peak hold circuit of FIG. 3 according to one embodiment.
Figure 5:
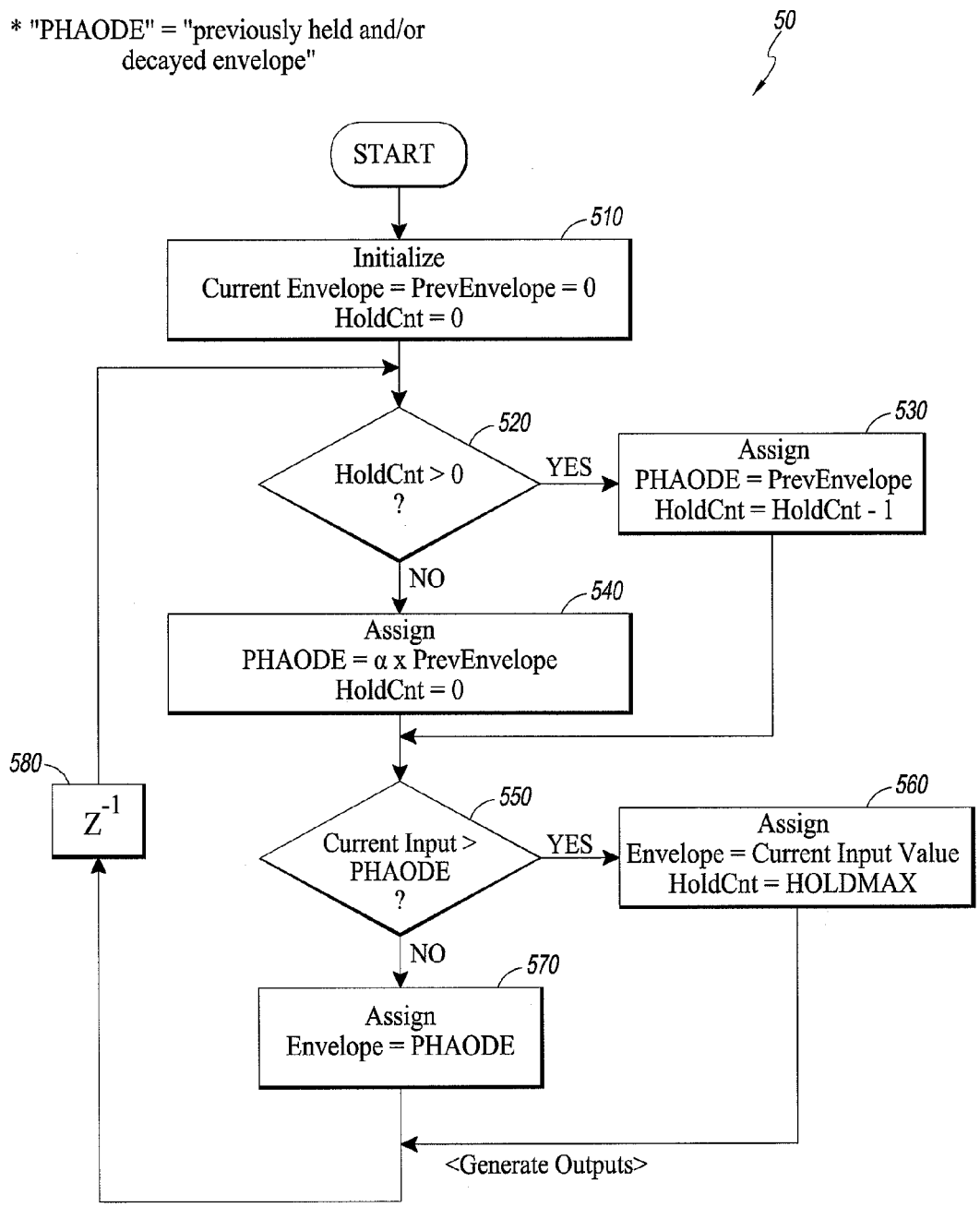
FIG. 5 is a flowchart showing an example operation of the peak hold circuit of FIG. 4 according to one embodiment.
Figure 8:
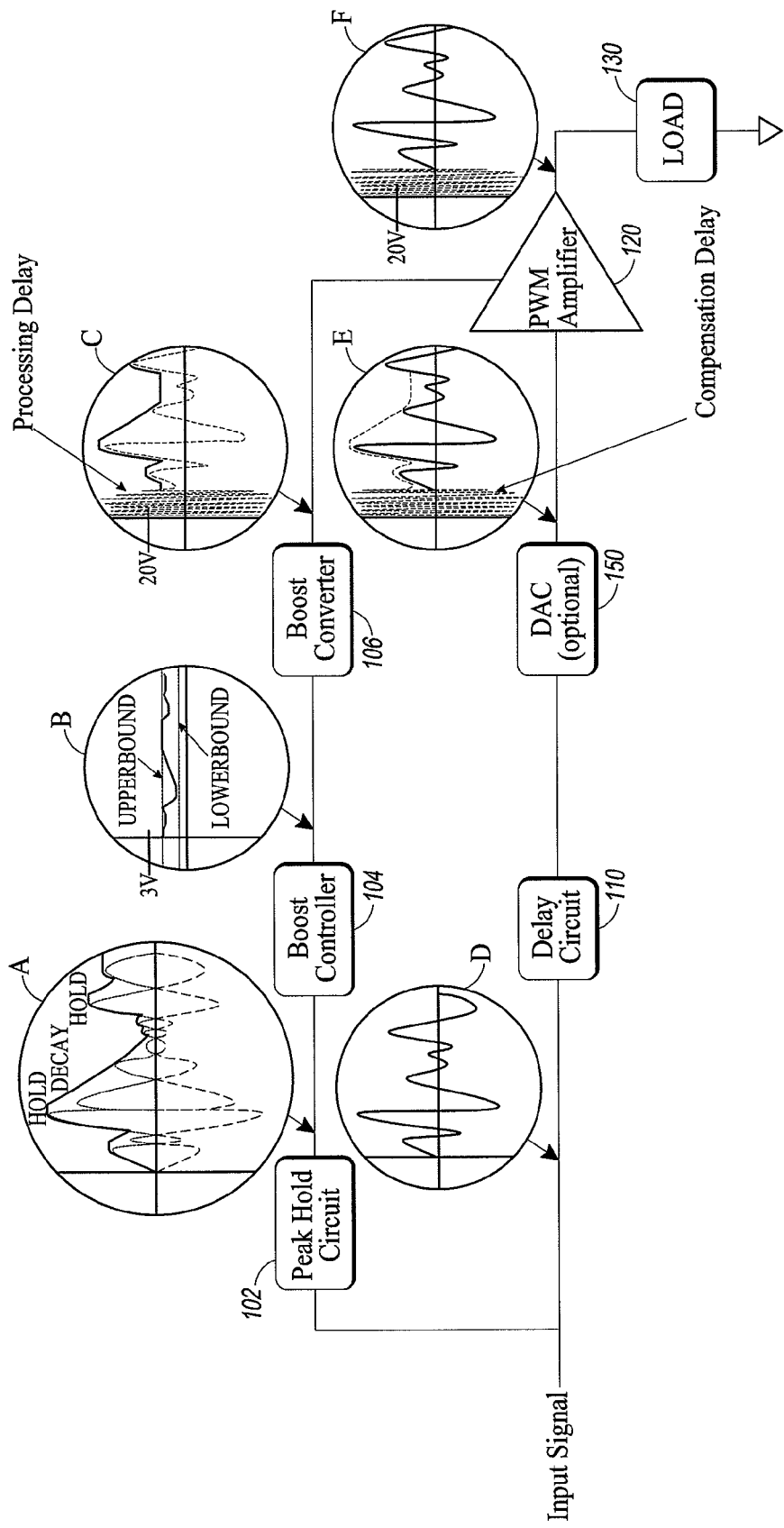
FIG. 8 illustrates example waveforms of the elements of the PWM system of FIG. 3 according to one embodiment.

FIG. 4 illustrates an example schematic diagram of the peak hold circuit 102 of FIG. 3 according to one embodiment. FIG. 5 is a flowchart showing an example operation or procedure 50 of the peak hold circuit 102 of FIG. 4 according to one embodiment. FIG. 8 illustrates example waveforms of the elements of the PWM system 10 of FIG. 3 according to one embodiment. In each of the waveforms in FIG. 8, the x-axis represents time and the y-axis represents amplitude such as voltage. Referring to FIGS. 4-5 and 8, the operation of the peak hold circuit 102 will be described.

As shown in FIG. 4, the peak hold circuit 102 includes an absolute value circuit 160, a first comparator 162, a second comparator 164, a subtractor 166, a multiplier 168, a first multiplexer 170, a holdmax block 172 and a second multiplexer 174. FIG. 4 illustrates merely an example of the peak hold circuit 102. Thus, the peak hold circuit 102 can have different configurations. Depending on the embodiment, certain elements may be removed or additional elements may be added to the peak hold circuit 102 illustrated in FIG. 4. Furthermore, two or more elements may be combined into a single element, or a single element may be realized as multiple elements. Moreover, the elements 160-174 of the peak hold circuit 102 can be implemented as a hardware element and/or a software module.

Referring to FIG. 5, an example procedure 50 of the peak hold circuit 102 will be described. In state 510, the peak hold circuit 102 initializes envelope values and hold count (Hold-Cnt) values such that a current envelope of the input signal is equal to a previous envelope, and the hold count value is equal to 0. In state 520, it is determined whether the hold count value is greater than 0. State 520 can be performed at least partially in the second comparator 164. In some embodiments, the peak hold circuit 102 uses at least two adjustable parameters, HOLD_MS and DECAY_MS, to optimize its dynamic behavior with respect to the input signal. HOLD_MS can determine the time in milliseconds in which newly found peaks will be held before entering the decay state. DECAY_MS can specify how much time in milliseconds before a decaying signal will reach, for example, $e^{-1}$, or approximately one-third of its value, etc.

If it is determined that the hold count value is greater than 0, the peak hold circuit 102 assigns a previous held and/or decayed envelope (to be indicated as "PHAODE" for the purpose of simplicity) as a previous envelope, and sets the hold count value as "hold count−1" (state 530). State 530 can be performed at least partially in the subtractor 166 and the first multiplexer 170.

If it is determined that the hold count value is not greater than 0, the peak hold circuit 102 assigns the PHAODE value as α×previous envelope ("×" means multiplication), and sets the hold count value as 0 (state 540). Here, α is a decay factor by which the previous envelope decays during a given sample period. In some embodiments, a is a function of DECAY_MS parameter. State 540 can be performed at least partially in the multiplier 168 and the first multiplexer 170.

In state 550, it is determined whether the magnitude of the current input signal is greater than the PHAODE value. State 550 can be performed in the absolute value circuit 160 and the first comparator 162.

If it is determined that the magnitude of the current input signal is greater than the PHAODE value, the peak hold circuit 102 assigns a current input value as a signal envelope to be output to the boost controller 104, and sets the hold count value as Holdmax (state 560). For example, at any moment in a given sample period, when the magnitude of the current input signal exceeds the PHAODE value, the peak hold circuit 102 determines that a new peak has been found, which becomes a new envelope value that will be output as the signal envelope during the sample period. The peak hold circuit 102 can respond quickly to new peaks, and can have the capability to control the hold and decay characteristics to best suit a particular implementation. In some embodiments, Holdmax is a function of the HOLD_MS parameter. State 560 can be performed at least partially in the holdmax block 172 and the second multiplexer 174.

If it is determined that the magnitude of the current input signal is not greater than the PHAODE value, the peak hold circuit 102 assigns the PHAODE value as the signal envelope such that the PHAODE value is output as the signal envelope (state 570). State 570 can be performed in the second multiplexer 174. After the states 560 and 570, the hold state is restarted in the next sample period after a predetermined delay (state 580).

In some embodiments, the input signal has a waveform D as shown in FIG. 8. The peak hold circuit 102 can generate a signal envelope having a waveform A as shown in FIG. 8. Example shapes of the held and decayed envelopes are included in the wave form A as shown in FIG. 8. These shapes can vary depending on specific implementations.

Figure 6:
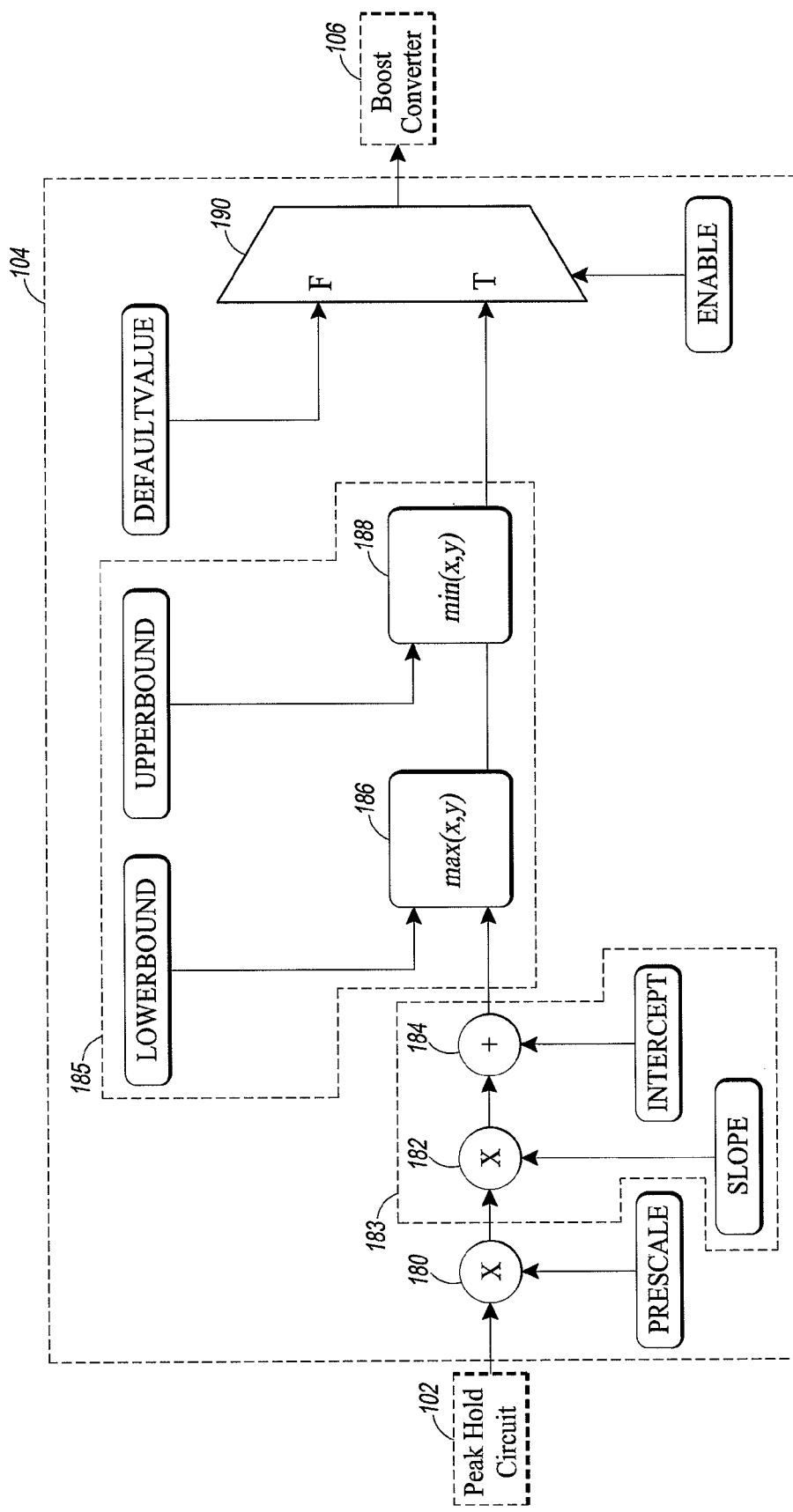
FIG. 6 illustrates an example schematic diagram of the boost controller of FIG. 3 connected between the peak hold circuit and the boost converter according to one embodiment.

FIG. 6 illustrates an example schematic diagram of the boost controller 104 of FIG. 3 connected between the peak hold circuit 102 and the boost converter 106 according to one embodiment. The boost controller 104 can transform the signal envelope received from the peak hold circuit 102 into a control signal which is suitable for steering the boost converter 106. For example, the boost controller 104 can map the signal envelope to a boost converter control signal. The mapping can be performed in several different forms, depending upon the configuration of the boost converter 106 used in a particular implementation.

In some embodiments, the boost controller 104 includes one or more adjustable parameters. The adjustable parameters can include at least one of the following: PRESCALE, SLOPE, INTERCEPT, UPPERBOUND and LOWERBOUND: The adjustable parameters can further include ENABLE. The adjustable parameters can be implemented as digital circuits and/or analog circuits. The adjustable parameters can also be implemented as hardware elements and/or software modules. Referring to FIG. 6, the operation of the boost controller 104 will be described.

In some embodiments, as shown in FIG. 6, the boost controller 104 includes a prescale unit 180, a linear mapping unit 183 and a control signal generator 185. The prescale unit 180 can convert the signal envelope received from the peak hold circuit 102 to a PWM amplifier rail voltage to be supplied to the boost converter 106. In some embodiments, the prescale unit 180 relates the signal envelope provided from the peak hold circuit 102 to a desired PWM amplifier rail voltage. For example, the prescale unit 180 scales the received signal envelope based on a predetermined scale value. The predetermined scale value can be a percentage of excess power to a desired supply voltage to support a given input signal.

The linear mapping unit 183 can substantially linearly map the scaled PWM amplifier rail voltage to a corresponding PWM control voltage to control the boost converter 106. In some embodiments, as shown in FIG. 6, the linear mapping unit 183 includes a slope block 182 and an intercept block 184. The output (y) of the linear mapping unit 183 can be expressed as y=SLOPE*x+INTERCEPT, or y=m*x+b, where * means multiplication.

The control signal generator 185 can control the linearly mapped PWM control voltage to remain within a predetermined voltage range. In some embodiments, as shown in FIG. 6, the control signal generator 185 includes a lower bound block 186 and an upper bound block 188. The lower and upper bound blocks 186 and 188 can respectively set lower and upper limits of the linearly mapped signal. The control signal generator 185 can maintain the linearly mapped signal within the specified range (between lower and upper bounds).

The enable unit or switching unit 190 allows for turning on or off the function of the boost controller 104. This switching function can be useful to test the PWM system 10. For example, with the boost controller 104 disabled, there would be no dynamic steering of the boost converter 106. In this situation, a default fixed supply voltage (default value) can be supplied to the PWM amplifier 120. A system manager can easily compare system efficiencies and the amounts of switching losses when the boost controller 104 is turned on and turned off.

In some embodiments, the output of the boost controller 104 can have waveform B as shown in FIG. 8. As shown in FIG. 8, the signal envelope (waveform A) provided from the peak hold circuit 102 is converted into a boost converter control signal (waveform B) that has lower and upper bounds.

Figure 7:
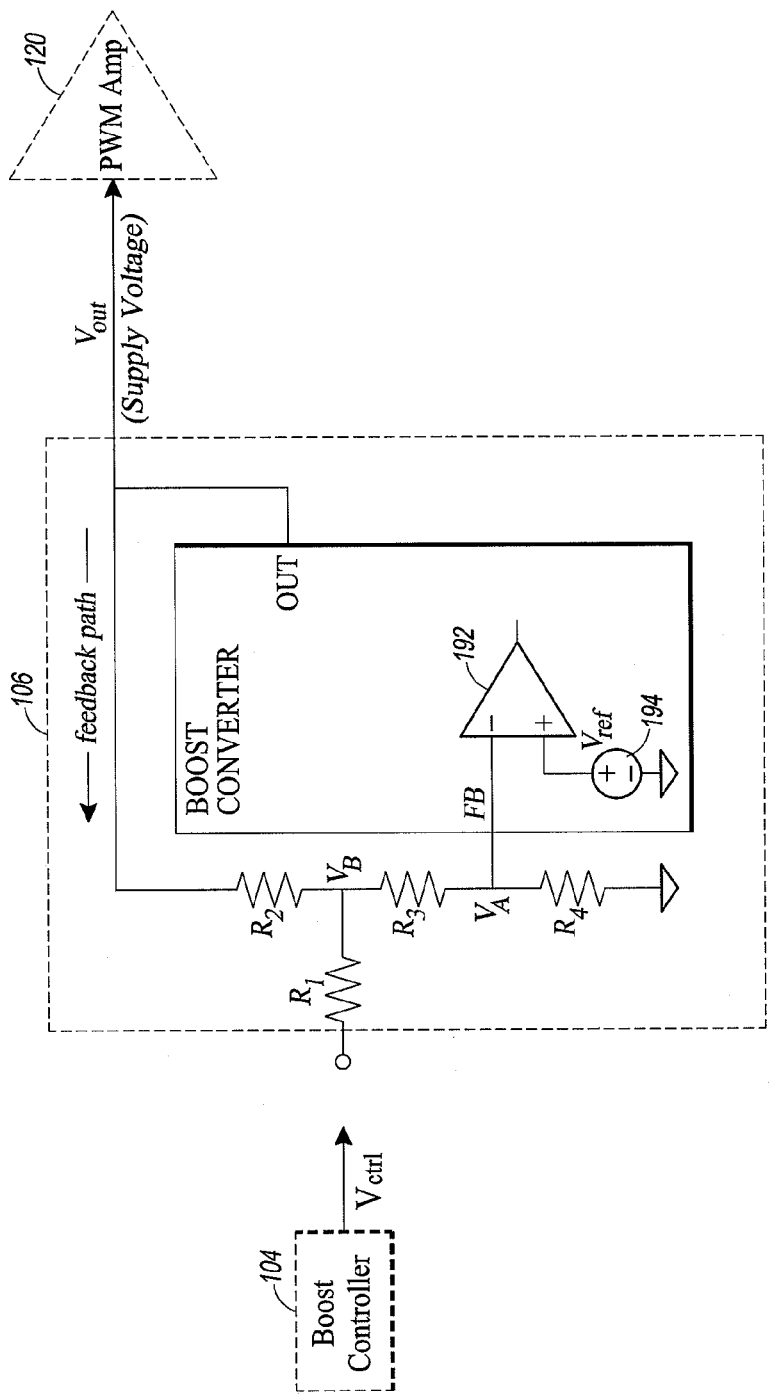
FIG. 7 illustrates an example schematic diagram of the boost converter of FIG. 3 connected between the boost controller and the PWM amplifier according to one embodiment.

FIG. 7 illustrates an example schematic diagram of the boost converter 106 of FIG. 3 connected between the boost controller 104 and the PWM amplifier 120 according to one embodiment.

The boost converter 106 can allow the boost controller 104 to dynamically steer the output $V_{out}$ (supply voltage) of the boost converter 106. In some embodiments, feedback action causes voltage $V_A$ to be substantially equal to $V_{ref}$ 194 by an OP amplifier 192. In these embodiments, the current through resistors $R_3$ and $R_4$ will be substantially fixed, and programmable by resistor $R_4$. Resistor $R_3$ can determine voltage $V_B$, which would typically be configured to be in the center of the operating range of the control voltage $V_{ctrl}$. Resistor $R_1$ can be used to drop the voltage of $V_{ctrl}$ to a certain desired level. Resistor $R_2$ can be used to drop the voltage of $V_{out}$ to a certain desired level. The combination of resistors $R_1$-$R_4$ can allow the control voltage $V_{ctrl}$ to either source or sink current from and into the voltage $V_B$ node and achieve the desired steering.

The boost converter 106 can be implemented as a switch-mode power supply (SMPS). The SMPS can generate the main supply rail voltage to be provided to the PWM amplifier 120 as the supply voltage. In some embodiments, the boost controller 104 produces a dynamic control signal that will also be fed into this feedback input (in addition to the normal feedback coming from the output ($V_{out}$) of the boost converter 106). This allows the DSP subsystem 140 or the boost controller 104 to dynamically steer the boost converter 106 in response to the demands of the current signal drive level. For example, if the input control voltage $V_{ctrl}$ falls, the boost converter 106 can respond by making the output voltage $V_{out}$ rise, and thus maintain the voltage $V_A$ to be substantially the same as $V_{ref}$ 194. Furthermore, if the input control voltage $V_{ctrl}$ rises, the boost converter 106 can respond by making the output voltage $V_{out}$ fall, and thus maintain the voltage $V_A$ to be substantially the same as $V_{ref}$ 194.

In some embodiments, the DSP subsystem 140 includes a DAC (not shown) that converts the (digital) output of the boost controller 104 into an analog signal which is used as the PWM supply voltage. The DAC can be connected between the boost controller 104 and the PWM amplifier 120. In these embodiments, the boost converter 106 can be omitted from the controller 100.

The output of the boost converter 106 can have a waveform C as shown in FIG. 8. As shown in FIG. 8, there is a time delay (processing delay) during which the control signal (PWM amplifier supply voltage) is being generated. The output of the delay circuit 110 or the output of the optional DAC 150 can be delayed in substantial synchronization with the supply voltage in order to compensate for the processing delay (compensation delay) that occurs at least in one of the peak hold circuit 102, the boost controller 104 and the boost converter 106 of the controller 100.

The output of the delay circuit 110 or the DAC 150 can have a waveform E as shown in FIG. 8. The PWM amplifier 120 can receive and amplify the delayed input signal having a waveform E based on the supply voltage having the waveform C, and provide the amplified signal having a waveform F to the load 130. The PWM waveforms shown in FIG. 8 are merely examples and can vary in specific implementations. Furthermore, the voltages (3V, 20V) shown in FIG. 8 are merely example voltages, and these voltages van vary for other implementations.

The PWM amplifier 120 can include a feedback function. The feedback function can cope with variations in its supply voltage. In some embodiments, in order to maintain a fixed input-to-output voltage gain, the PWM amplifier 120 can dynamically monitor its output and compensate its duty cycle as necessary. For example, if the supply voltage begins to droop, the PWM amplifier 120 can increase the duty cycle to supply the requisite power to the load 130.

In some embodiments, the level of the supply voltage is adequate to supply the load 130. The PWM amplifier's feedback can produce a PWM signal whose duty cycle is substantially 100%. In these embodiments, some level of overhead in the generated supply voltage may be desirable to optimize or balance the savings due to reduced switching losses, with the adverse effects of increased conduction losses. For example, the controller 100 can increase the supply voltage overhead to target a PWM duty cycle at a lower value, such as about 90%. The adjustable parameters provided in the peak hold circuit 102 and boost controller 104 can be used to achieve this balance.

According to at least one of the disclosed embodiments, switching losses can be substantially reduced by dynamically adjusting a supply voltage for a PWM system 10. For example, the PWM system 10 can be produced to actually steer the supply voltage dynamically, so that the supply voltage is not overly conservative, just to service the rare but important peak events. Several adjustable parameters can be used to assist engineers or system managers in optimizing the dynamic behavior of the system for any specific implementation.

While the above description has pointed out features of various embodiments, the skilled person will understand that various omissions, substitutions, and changes in the form and details of the device or process illustrated may be made without departing from the scope of the appended claims.

What is claimed is:

1. An apparatus for controlling a pulse width modulation (PWM) amplifier, comprising:
    a delay circuit configured to delay an input signal and provide the delayed input signal to the PWM amplifier; and
    a controller configured to generate and provide a supply voltage to the PWM amplifier based at least in part on the input signal such that the PWM amplifier generates an output signal based at least partially on the delayed input signal and the supply voltage, and wherein the controller is further configured to dynamically adjust the supply voltage based on the input signal and at least one further parameter, wherein the at least one parameter is an adjustable PRESCALE, and wherein the PRESCALE scales the supply voltage based on a predetermined scale value, the predetermined scale value being a linear function of the input signal detected over a sample time period.

2. The apparatus of claim 1, wherein the delay circuit is further configured to provide the delayed input signal to the PWM amplifier in substantial synchronization with the supply voltage such that the PWM amplifier amplifies the delayed input signal based at least partially on the supply voltage.

3. The apparatus of claim 1, wherein the controller comprises:
    a peak hold circuit configured to track peaks of the input signal and generate a signal envelope for a predetermined sample period; and
    a boost controller configured to transform the signal envelope into a PWM control voltage.

4. The apparatus of claim 3, wherein the peak hold circuit, the boost controller and the delay circuit are included in a digital signal processor (DSP).

5. The apparatus of claim 3, wherein the boost controller comprises:
    a prescale unit configured to convert the signal envelope to a PWM amplifier rail voltage;
    a linear mapping unit configured to substantially linearly map the PWM amplifier rail voltage to the PWM control voltage; and
    a control signal generator configured to maintain the PWM control voltage within a predetermined voltage range.

6. The apparatus of claim 3, wherein the controller further comprises an enable unit configured to turn on and off the boost controller.

7. The apparatus of claim 3, wherein the controller further comprises a boost converter configured to maintain the level of the PWM control voltage at a predetermined reference voltage or within a predetermined voltage range.

8. The apparatus of claim 7, wherein the boost converter comprises a switch mode power supply (SMPS).

9. The apparatus of claim 1, further comprising a digital to analog converter configured to convert the delayed input signal into an analog signal and to provide the analog signal to the PWM amplifier.

10. An apparatus for controlling an amplifier, comprising:
    a delay circuit configured to delay an input signal and provide the delayed input signal to the amplifier; and
    a controller configured to generate and provide a supply voltage to the amplifier based at least in part on the input signal such that the amplifier generates an output signal based at least partially on the delayed input signal and the supply voltage, and wherein the controller is further configured to dynamically adjust the supply voltage based on the input signal and at least one further parameter, wherein the at least one parameter is an adjustable PRESCALE, and wherein the PRESCALE scales the supply voltage based on a predetermined scale value, the predetermined scale value being a linear function of the input signal detected over a sample time period.

11. The apparatus of claim 10, wherein the delay circuit is further configured to provide the delayed input signal to the amplifier in substantial synchronization with the supply voltage such that the amplifier amplifies the delayed input signal based at least partially on the supply voltage.

12. The apparatus of claim 10, wherein the amplifier comprises a pulse width modulation (PWM) amplifier.

13. A pulse width modulation (PWM) system, comprising:
    a delay circuit configured to delay an input signal;
    a pulse width modulation (PWM) amplifier configured to generate an output signal based at least partially on the delayed input signal and the supply voltage, and provide the output signal to a load; and
    a controller configured to generate and provide the supply voltage to the PWM amplifier based at least in part on the input signal, and wherein the controller is further configured to dynamically adjust the supply voltage based on the input signal and at least one further parameter, wherein the at least one parameter is an adjustable PRESCALE, and wherein the PRESCALE scales the supply voltage based on a predetermined scale value, the predetermined scale value being a linear function of the input signal detected over a sample time period.

14. The PWM system of claim 13, wherein the controller is further configured to monitor the output signal of the PWM amplifier to be supplied to the load, and adjust the supply voltage based on the monitored output.

15. The PWM system of claim 13, wherein the delay circuit is further configured to provide the delayed input signal to the PWM amplifier in substantial synchronization with the supply voltage such that the PWM amplifier amplifies the delayed input signal based at least partially on the supply voltage.

16. The PWM system of claim 13, wherein the PWM amplifier comprises a feedback loop configured to maintain the supply voltage at a predetermined reference voltage or within a predetermined voltage range.

17. The PWM system of claim 13, wherein the controller comprises:
   a peak hold circuit configured to track peaks of the input signal and generate a signal envelope for a predetermined sample period;
   a boost controller configured to transform the signal envelope into a PWM control voltage; and
   a boost converter configured to maintain the level of the PWM control voltage at a predetermined reference voltage or within a predetermined voltage range.

\* \* \* \* \*